United States Patent
Shei et al.

(10) Patent No.: US 7,151,281 B2
(45) Date of Patent: Dec. 19, 2006

(54) LIGHT-EMITTING DIODE STRUCTURE WITH ELECTROSTATIC DISCHARGE PROTECTION

(75) Inventors: Shih-Chang Shei, Tainan (TW); Jinn-Kong Sheu, Tainan County (TW)

(73) Assignee: South Epitaxy Corporation, Tainan (TW)

( * ) Notice: Subject to any disclaimer, the term of this patent is extended or adjusted under 35 U.S.C. 154(b) by 287 days.

(21) Appl. No.: 10/711,531

(22) Filed: Sep. 24, 2004

(65) Prior Publication Data

US 2005/0167680 A1    Aug. 4, 2005

(30) Foreign Application Priority Data

Feb. 2, 2004   (TW) .............................. 93102264 A

(51) Int. Cl.
*H01L 27/15* (2006.01)
*H01L 29/16* (2006.01)

(52) U.S. Cl. .............................. 257/79; 257/81; 257/82; 257/84; 257/85; 257/86; 257/90; 257/94; 257/99; 257/355; 257/E33.057

(58) Field of Classification Search ................ 257/79, 257/94, 90, 96, 81–82, 84–86, 355, E33.027
See application file for complete search history.

(56) References Cited

U.S. PATENT DOCUMENTS 6,593,597 B1 *   7/2003   Sheu ............................ 257/94
6,841,802 B1 *   1/2005   Yoo ............................. 257/98

\* cited by examiner

*Primary Examiner*—Kenneth Parker
*Assistant Examiner*—Joseph Nguyen
(74) *Attorney, Agent, or Firm*—Jianq Chyun IP Office

(57) ABSTRACT

A light-emitting diode (LED) structure with electrostatic discharge (ESD) protection is described. The LED includes a substrate, a patterned semiconductor layer, a first electrode and a second electrode. The patterned semiconductor layer is disposed over the substrate, and is divided into at least a first island structure and a second island structure. The first electrode and the second electrode are connected between the first island structure and the second island structure. A shunt diode is formed by the first electrode, the second electrode and the second island structure. The shunt diode is connected in parallel to the LED with an inverse voltage compared to the LED. In the LED structure of the invention, the first island structure and the second island structure are manufactured simultaneously by the epitaxy procedure. Therefore, the LED could be protected from damage due to electrostatic discharge (ESD).

26 Claims, 3 Drawing Sheets

LIGHT-EMITTING DIODE STRUCTURE WITH ELECTROSTATIC DISCHARGE PROTECTION

CROSS-REFERENCE TO RELATED APPLICATION

This application claims the priority benefit of Taiwan application serial no. 93102264, filed Feb. 2, 2004.

BACKGROUND OF THE INVENTION

1. Field of the Invention

The present invention generally relates to a light emitting diode (LED) and a method thereof. More particularly, the present invention relates to a LED structure having electrostatic discharge (ESD) protection function.

2. Description of Related Art

In general, light emitted by a light emitting diode (LED) comprising a III–V compound semiconductor material has a wide bandgap of emitting light covering almost all the wavelength range of infrared (IR), ultra-violet (UV) and visible light. For a LED device, the internal quantum efficiency and the external quantum efficiency (or so-called light extraction efficiency) are two important parameters. Conventionally, the method of increasing the internal quantum efficiency is to improve the crystal quality of the light emitting layer and the design of the layer structure. The method of increasing the external quantum efficiency is to reduce energy loss of the light emitted by the light emitting layer by reducing total reflection or other effect in the LED device.

Since the luminous efficiency of LED has been enhanced drastically, conventional fluorescent lamp and incandescent bulb are gradually replaced by LED and applied in many applications. For example, LED may be provided as a light source for a variety of electronic appliances, such as, scanner that requires high response speed, a liquid crystal display (LCD), a driving panel of a motor, traffic light, and other conventional lighting devices. Furthermore, the advantages of LED in comparison with conventional bulb are, for example, small size, long lifetime, low driving voltage/current, non-fragile, low thermal generating in operation, low contamination (mercury free), low power consumption and high luminous efficiency. It is noted that, although LED has so many advantages described above, however, the disadvantages of the LED is that it gets easily damaged by an abnormal voltage or electrostatic discharge (ESD). Therefore, a conventional method for preventing the damage is to connect a Zener diode in parallel to the LED from the abnormal voltage or electrostatic discharge.

FIG. 1 is an equivalent circuit diagram schematically illustrating a LED package structure having a conventional electrostatic discharge (ESD) protection circuit. Referring to FIG. 1A, to avoid the damage of LED 30 from the electrostatic discharge during operation, the LED 30 and a Zener diode 40 are connected in parallel. The Zener diode 40 is operated in the breakdown region, thus the Zener diode 40 remains electrically conducted. Therefore, when a normal forward voltage is applied to the two ends V+ and V− of LED 30, the LED 30 is operated normally. However, when an abnormal voltage or electrostatic charge is generated, the over level high voltage is discharged by the Zener diode 40 that operates in the breakdown region. Therefore, the LED 30 is protected from the damage of the abnormal voltage or high voltage due to the abnormal electrostatic charge, and an irreversible damage to the LED 30 can be avoided.

FIG. 1B is a cross-sectional view schematically illustrating a LED package structure having a conventional electrostatic discharge (ESD) protection circuit. Referring to FIG. 1B, the gallium nitride (GaN) LED 30 of FIG. 1 includes a transparent substrate 32, a N-type a doped gallium nitride (GaN) layer 34, a P-type doped gallium nitride (GaN) layer 36 and two electrodes 38a, 38b. The Zener diode 40 of FIG. 1A comprises an N-type doped silicon 42, a P-type doped silicon 44 and metal layers 46a, 46b. Furthermore, the bumps 50a, 50b of FIG. 1B is generally composed of a solder material. The P-type doped silicon 44 is electrically connected to the N-type doped gallium nitride (GaN) layer 34 by the bump 50a, and the N-type doped silicon 42 is electrically connected to the P-type doped gallium nitride (GaN) layer 36 by bump 50b.

In summary, although the circuit structure described above can prevent the LED from the damage due to the electrostatic discharge. However, the process of fabricating the circuit structure is complicated as it requires a number of additional process steps, such as, the step of forming the P-type doped silicon 44 in the N-type doped silicon 42 requiring expensive apparatus, namely, an ion implanter, related gas supporting devices and vacuum system. Accordingly, the overall packaging time and cost of the LED structure having conventional electrostatic discharge (ESD) protection circuit are increased.

SUMMARY OF THE INVENTION

The present invention is related to a LED structure having electrostatic discharge (ESD) protection function in which a shunt diode is connected in parallel to the LED with an inverse voltage compared to the LED. Therefore, the LED can be protected from the damage due to electrostatic discharge.

The LED structure includes, for example but not limited to, a substrate, a patterned semiconductor layer, a first electrode and a second electrode. The patterned semiconductor layer is disposed over the substrate. The patterned semiconductor layer includes, for example but not limited to, a first type doped semiconductor layer, a light emitting layer disposed over a portion of the first type doped semiconductor layer, and a second type doped semiconductor layer disposed over the light emitting layer. Furthermore, the first type doped semiconductor layer, the light emitting layer and the second type doped semiconductor layer of the patterned semiconductor layer are defined into at least a first island structure and a second island structure. The first electrode is connected between the first type doped semiconductor layer of the first island structure and the second type doped semiconductor layer of the second island structure. The second electrode is connected between the second type doped semiconductor layer of the first island structure and the first type doped semiconductor layer of the second island structure. Therefore, a LED constitutes the first electrode, the second electrode and the first island structure, and a shunt diode is formed by the first electrode, the second electrode and the second island structure. The shunt diode is connected in parallel to the LED with an inverse voltage compared to the LED, wherein shunt diode includes, for example but not limited to, a Schottky diode, a Zener diode, or a heterojunction diode.

In one embodiment of the present invention, the substrate comprises, for example but not limited to, aluminum oxide, silicon carbide (SiC), zinc oxide (ZnO), silicon (Si), gallium phosphide (GaP) or gallium arsenide (GaAs) substrate. Furthermore, the first type doped semiconductor layer comprises, for example but not limited to, a nucleation layer, a buffer layer and a first confinement layer. The nucleation layer is disposed over the substrate, the buffer layer is disposed over the nucleation layer, and the first confinement layer is disposed over a portion of the buffer layer.

In one embodiment of the present invention, the material of the nucleation layer comprises, for example but not limited to, $Al_eIn_fGa_{1-e-f}N$, e, f≧0; 0≦e+f≦1, and the nucleation layer is N-type or P-type doped. Furthermore, a material of the buffer layer comprises, for example but not limited to, $Al_cIn_dGa_{1-c-d}N$, c, d≧0; 0≦c+d<1, and the buffer layer is N-type doped. The first confinement layer comprises, for example but not limited to, N-type doped $Al_xIn_yGa_{1-x-y}N$, x, y≧0; 0≦x+y<1; x>c.

In one embodiment of the present invention, the light emitting layer comprises, for example but not limited to, doped $Al_aIn_bGa_{1-a-b}N/Al_xIn_yGa_{1-x-y}N$ quantum well structure, and a, b≧0; 0≦a+b<1; x, y≧0; 0≦x+y<1; x>c>a. Furthermore, the light emitting layer is, for example, doped with an N-type dopant or a P-type dopant, or comprises, for example but not limited to, undoped $Al_aIn_bGa_{1-a-b}N/Al_xIn_yGa_{1-x-y}N$ quantum well structure, a, b≧0; 0≦a+b<1; x, y≧0; 0≦x+y<1; x>c>a.

In one embodiment of the present invention, the second type doped semiconductor layer comprises, for example but not limited to, a second confinement layer and a contact layer. The second confinement layer is disposed over the light emitting layer, and the contact layer is disposed over the second confinement layer. The second confinement layer comprises, for example but not limited to, $Al_xIn_yGa_{1-x-y}N$, x, y≧0; 0≦x+y<1; x>c. Furthermore, the contact layer comprises, for example but not limited to, a strained layer superlattice (SLS). The strained layer superlattice (SLS) comprises, for example but not limited to, modulation doped $Al_uIn_vGa_{1-u-v}N/Al_xIn_yGa_{1-x-y}N$ quantum well structure, u, v≧0; 0≦u+v≦1; x, y≧0; 0<x+y<1; x>u. The strained layer superlattice (SLS) is doped with, for example but not limited to, an N-type dopant or a P-type dopant. Moreover, one embodiment of the present invention further comprises a transparent conductive layer disposed over the contact layer.

In one embodiment of the present invention, the first electrode or the second electrode comprises, for example but not limited to, Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Au, Cr/Pt/Au, Cr/Pd/Au, Cr/Ti/Au, Cr/TiWx/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au Nd/Al/Co/A, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au TiWN$_x$/Ti/Au, TiWN$_x$/Pt/Au, TiWN$_x$/Ni/Au, TiWN$_x$/Pd/Au, TiWN$_x$/Cr/Au, TiWN$_x$/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au or Ti/NiAl/Cr/Au.

In one embodiment of the present invention, the transparent conductive layer comprises, for example but not limited to, Ni/Au, Ni/Pt, Ni/Pd, Ni/Co, Pd/Au, Pt/Au, Ti/Au, Cr/Au, Sn/Au, Ta/Au, TiN, TiWN$_x$ or WSi$_x$. The transparent conductive layer may also comprise a N-type transparent conductive-oxide layer or a P-type transparent conductive oxide layer. The N-type transparent conductive oxide layer comprises, for example but not limited to, ITO, CTO, ZnO:Al, ZnGa$_2$O$_4$, SnO$_2$:Sb, Ga$_2$O$_3$:Sn, AgInO$_2$:Snor In$_2$O$_3$:Zn. The P-type transparent conductive oxide layer comprises, for example but not limited to, CuAlO$_2$, LaCuOS, NiO, CuGaO$_2$ or SrCu$_2$O$_2$.

Accordingly, in the aforementioned LED structure having electrostatic discharge (ESD) protection function, the LED and the shunt diode may be fabricated simultaneously. The shunt diode can protect the LED from the damage due to electrostatic discharge. Furthermore, the cost can be reduced since the process of fabricating the LED and the shunt diode are compatible with the conventional semiconductor process and may be fabricated simultaneously.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The following drawings illustrate embodiments of the invention and, together with the description, serve to explain the principles of the invention.

DESCRIPTION OF THE EMBODIMENTS

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1A:
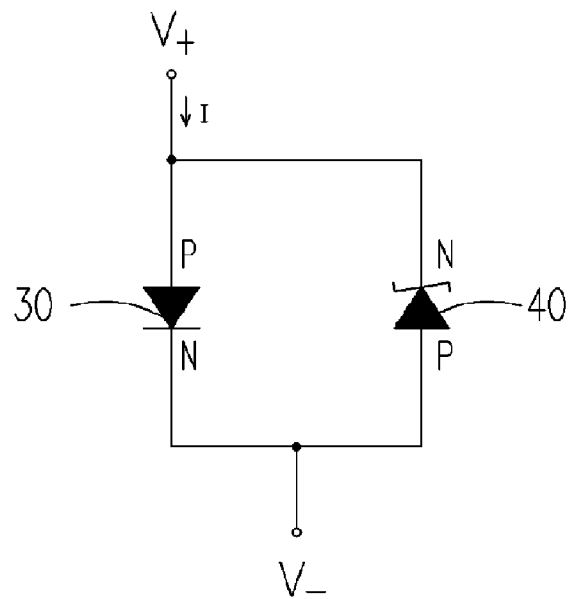
FIG. 1A is an equivalent circuit diagram schematically illustrating a LED package structure having a conventional electrostatic discharge (ESD) protection circuit.
Figure 1B:
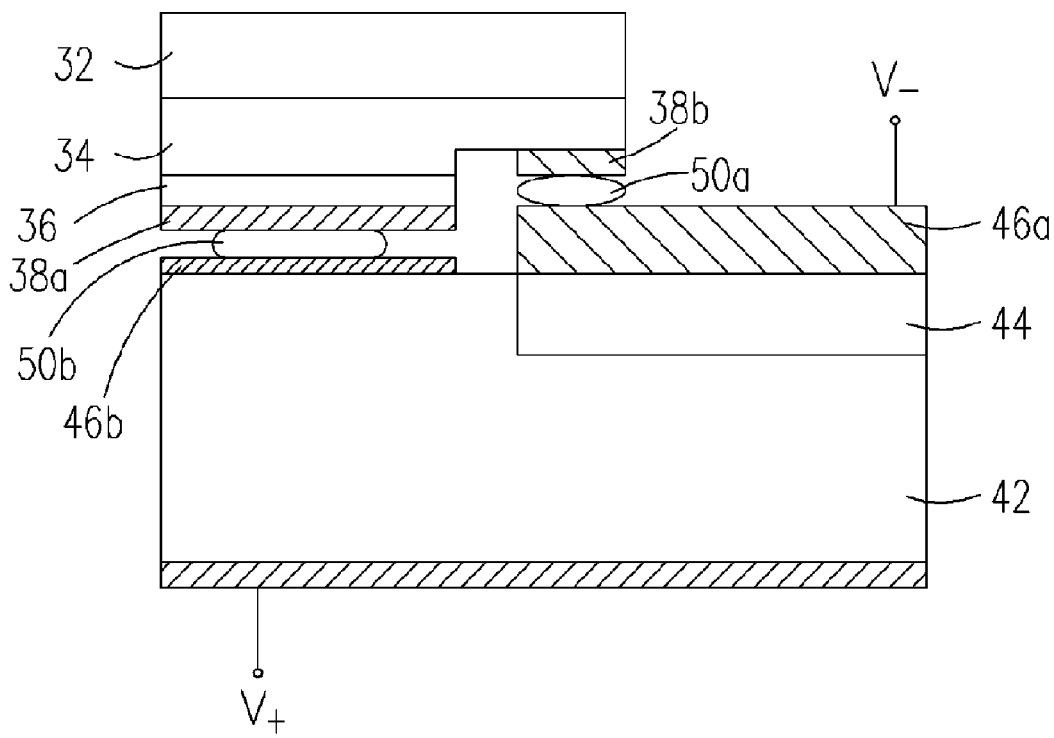
FIG. 1B is a cross-sectional view schematically illustrating a LED package structure having a conventional electrostatic discharge (ESD) protection circuit.
Figure 2:
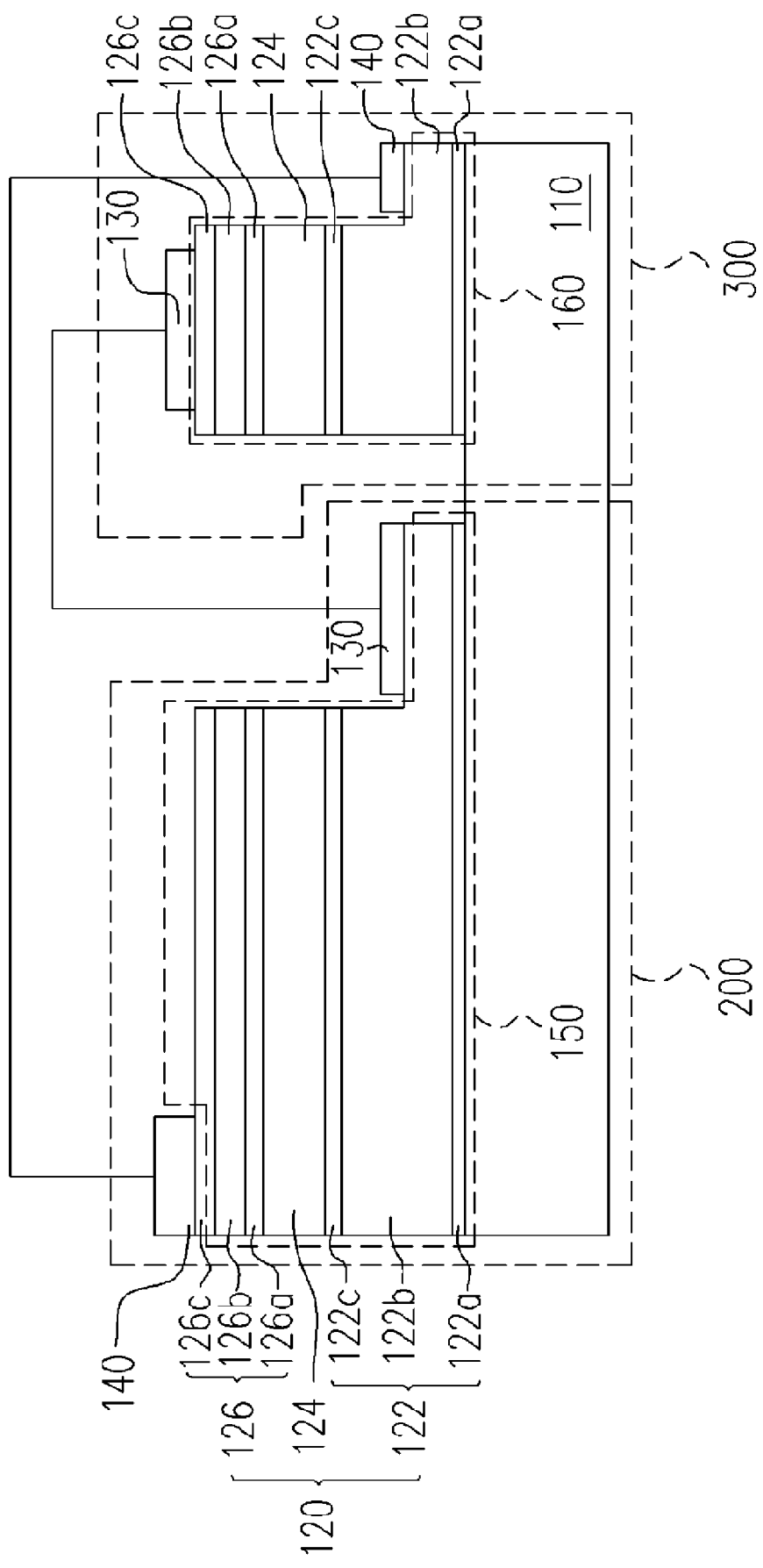
FIG. 2 is a cross-sectional view schematically illustrating a LED including electrostatic discharge (ESD) protection function according to one embodiment of the present invention.

FIG. 2 is a cross-sectional view schematically illustrating a LED including electrostatic discharge (ESD) protection function according to one embodiment of the present invention. Referring to FIG. 2, the LED includes, for example but not limited to, a substrate 110, a patterned semiconductor layer 120, a first electrode 130 and a second electrode 140. The patterned semiconductor layer 120 is disposed over the substrate 110. The patterned semiconductor layer 120 includes, for example but not limited to, a first type doped semiconductor layer 122, a light emitting layer 124 disposed on a portion of the first type doped semiconductor layer 122, and a second type doped semiconductor layer 126 disposed on the light emitting layer 124. Furthermore, the first type doped semiconductor layer 122, the light emitting layer 124 and the second type doped semiconductor layer 126 is defined into at least a first island structure 150 and a second island structure 160.

Referring to FIG. 2, the first electrode 130 is connected between the first type doped semiconductor layer 122 of the first island structure 150 and second type doped semiconductor layer 126 of the second island structure 160. The second electrode 140 is connected between the second type doped semiconductor layer 126 of the first island structure 150 and the first type doped semiconductor layer 122 of the second island structure 160. In addition, a LED 200 is constituted of the first electrode 130, the second electrode 140, and the first island structure 150. A shunt diode 300 is formed by the first electrode 130, the second electrode 140, and the second island structure 160. The shunt diode 300 includes, for example but not limited to, a Schottky diode, a Zener diode, a heterojunction diode or other diode structures. The shunt diode 300 is connected in parallel to the LED 200 with an inverse voltage compared to the LED; therefore the LED 200 can be protected from damage due to electrostatic discharge.

In the embodiment of the invention, the fabrication process is compatible with conventional process of fabricating the first island structure 150 and the second island structure 160. Therefore, the shunt diode 300 and the LED 200 can be easily integrated. Referring to FIG. 2, the process of fabricating the shunt diode 300 and the LED 200 includes the following steps. First, a first type doped semiconductor layer 122, a light emitting layer 124 and a second type doped semiconductor layer 126 are sequentially formed over the substrate 110 sequentially. These semiconductor layers may be formed over the substrate 110 by, for example but not limited to, epitaxy process. Then, the first type doped semiconductor layer 122, the light emitting layer 124 and the second type doped semiconductor layer 126 are patterned to form a first island structure 150 and a second island structure 160 as shown in FIG. 2. Since the substrate 110 is an insulating material, the first island structure 150 and the second island structure 160 may be regarded as electrically insulated from each other. Then, a first electrode 130 and a second electrode 140 including a specific pattern distribution are formed over the substrate 110; therefore, the shunt diode 300 is connected in parallel to the LED 200 with a reverse direction of voltage.

The first type doped semiconductor layer 122 includes, for example but not limited to, a nucleation layer 122a, a buffer layer 122b and a first confinement layer 122c. The nucleation layer 122a is disposed over the substrate 110, the buffer layer 122b is disposed over the nucleation layer 122a, and the first confinement layer 122c is disposed over a portion of the buffer layer 122b. Furthermore, the second type doped semiconductor layer 126 includes, for example but not limited to, a second confinement layer 126a, a contact layer 126b and a transparent conductive layer 126c. The second confinement layer 126a is disposed over the light emitting layer 124, the contact layer 126b is disposed over the second confinement layer 126a, and the transparent conductive layer 126c is disposed over the contact layer 126b.

Hereinafter, the LED structure having electrostatic discharge (ESD) protection function in accordance with an embodiment of the present invention will be described in detail. The substrate 110 comprises, for example but not limited to, aluminum oxide, silicon carbide (SiC), zinc oxide (ZnO), silicon (Si), gallium phosphide (GaP) or gallium arsenide (GaAs). Furthermore, the nucleation layer 122a of the first type doped semiconductor layer 122 comprises, for example but not limited to, $Al_eIn_fGa_{1-e-f}N$, wherein e, f≧0 and 0≦e+f≦1. The nucleation layer 122a may be doped with an N-type dopant or a P-type dopant. Moreover, the buffer layer 122b comprises, for example but not limited to, $Al_cIn_dGa_{1-c-d}N$, wherein c, d≧0 and 0≦c+d<1. The buffer layer 122b is doped with, for example but not limited to, an N-type dopant. The first confinement layer 122c comprises, for example but not limited to N-type doped, $Al_xIn_yGa_{1-x-y}N$, wherein x, y≧0, 0≦x+y<1 and x>c.

The light emitting layer 124 comprises, for example but not limited to, doped $Al_aIn_bGa_{1-a-b}N/Al_xIn_yGa_{1-x-y}N$ quantum well structure, wherein a, b≧0, 0≦a+b<1, x, y≧0, 0≦x+y<1 and x>c>a. The light emitting layer 124 is doped with, for example but not limited to, an N-type dopant or a P-type dopant. Furthermore, the light emitting layer 124 of the invention may also comprise undoped $Al_aIn_bGa_{1-a-b}N/Al_xIn_yGa_{1-x-y}N$ quantum well structure, wherein a, b≧0, 0≦a+b<1, x, y≧0, 0≦x+y<1 and x>c>a.

In the second type doped semiconductor layer 126 of the embodiment described above, the second confinement layer 126a comprises, for example but not limited to, $Al_xIn_yGa_{1-x-y}N$, wherein x, y≧0, 0≦x+y<1 and x>c. The contact layer 126b comprises, for example but not limited to, strained layer superlattice (SLS). The strained layer superlattice (SLS) comprises, for example but not limited to, modulation doped $Al_uIn_vGa_{1-u-v}N/Al_xIn_yGa_{1-x-y}N$ quantum well structure, wherein u, v≧0, 0≦u+v≦1, x, y≧0, 0≦x+y<1 and x>u. The strained layer superlattice (SLS) is doped with, for example but not limited to, an N-type dopant or a P-type dopants. The transparent conductive layer 126c comprises, for example but not limited to, indium tin oxide (ITO).

The first electrode 130 or the second electrode 140 of the embodiment comprises, for example but not limited to, Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Au, Cr/Pt/Au, Cr/Pd/Au, Cr/Ti/Au, Cr/TiWx/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au Nd/Al/Co/A, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au $TiWN_x$/Ti/Au, $TiWN_x$/Pt/Au, $TiWN_x$/Ni/Au, $TiWN_x$/Pd/Au, $TiWN_x$/Cr/Au, $TiWN_x$/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au or Ti/NiAl/Cr/Au.

In the embodiment, the transparent conductive layer 126c comprises, for example but not limited to, Ni/Au, Ni/Pt, Ni/Pd, Ni/Co, Pd/Au, Pt/Au, Ti/Au, Cr/Au, Sn/Au, Ta/Au, TiN, $TiWN_x$ or $WSi_x$. The transparent conductive layer 126c is further comprised of, for example but not limited to, N-type transparent conductive oxide layer or P-type transparent conductive oxide layer. The N-type transparent conductive oxide layer comprises, for example but not limited to, ITO, CTO, ZnO:Al, $ZnGa_2O_4$, $SnO_2$:Sb, $Ga_2O_3$:Sn, $AgInO_2$:Snor $In_2O_3$:Zn. The P-type transparent conductive oxide layer comprises, for example but not limited to, $CuAlO_2$, LaCuOS, NiO, $CuGaO_2$ or $SrCu_2O_2$.

In the embodiment described above, the transparent conductive layer 126c is disposed, for example but not limited to, over the contact layer 126b. However, in another embodiment of the present invention, the transparent conductive layer 126c may be omitted.

Figure 3:
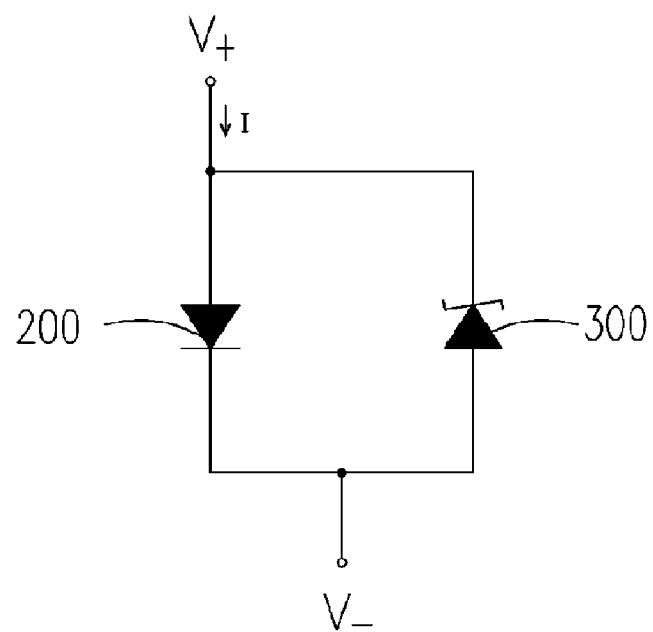
FIG. 3 is an equivalent circuit diagram schematically illustrating the LED structure circuit shown in FIG. 2.

FIG. 3 is an equivalent circuit diagram schematically illustrating the LED structure circuit shown in FIG. 2. Referring to FIG. 3, the shunt diode 300 is connected in parallel to the LED 200 with an inverse voltage compared to the LED 200 to protect the LED 200 from damage due to abnormal voltage or electrostatic discharge (ESD). The shunt diode 300 is operated in the breakdown region, thus the shunt diode 300 remains electrically conducted. Therefore, when a normal forward voltage is applied to the two ends V+ and V− of the LED 200, a forward current is generated by the carriers passing through the P, N junction of the LED 200, and thus the LED 200 emits light. However, when abnormal voltage or electrostatic charge event occurs, the excessively high voltage is discharged by the shunt diode 300 that is operative in the breakdown region, and thus the high voltage does not flow to the LED 200. Therefore, the LED 200 is protected from the damage due to electrostatic discharge caused by an abnormal voltage or excessively high voltage.

Figure 4:
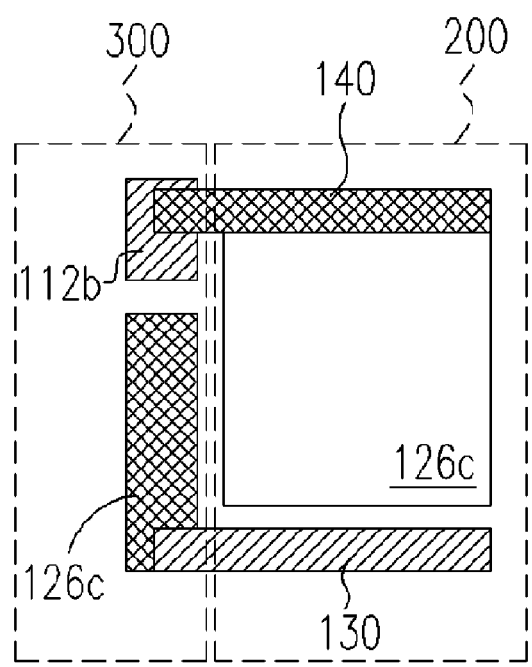
FIG. 4 is a top view schematically illustrating the LED structure having electrostatic discharge (ESD) protection function according to an embodiment of the present invention.

FIG. 4 is a top view schematically illustrating the LED structure having electrostatic discharge (ESD) protection function according to an embodiment of the present invention. Referring to FIG. 4, the first electrode 130 is connected to the buffer layer 122b of the LED 200 and the transparent conductive layer 126c of the shunt diode 300. The second electrode 140 is connected to the transparent conductive layer 126c of the LED 200 and the buffer layer 122b of the shunt diode 300.

Accordingly, the LED structure having electrostatic discharge (ESD) protection function in accordance with an embodiment of the present invention has the following advantages. In the LED structure having electrostatic discharge (ESD) protection function, the shunt diode is connected in parallel to the LED with an inverse voltage compared to the LED. Therefore, the electrostatic charge due to abnormal voltage or high voltage could be discharged away from the LED by the shunt diode. Thus, the lifetime of the LED can be increased.

In addition, the LED structure and the shunt diode can be fabricated simultaneously since the materials of the LED and the shunt diode are the same. Therefore, no additional process steps are required to fabricate a protection device as compared with conventional process, and thus the fabrication cost thereof can be reduced.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A light emitting diode (LED) structure, having electrostatic discharge (ESD) protection function, comprising:
    a substrate;
    a patterned semiconductor layer, disposed over the substrate,
    wherein the patterned semiconductor layer comprises:
    a first type doped semiconductor layer;
    a light emitting layer, disposed over a portion of the first type doped semiconductor layer; and
    a second type doped semiconductor layer, disposed over the light emitting layer, wherein the first type doped semiconductor layer, the light emitting layer and the second type doped semiconductor layer of the patterned semiconductor layer are defined into at least a first island structure and a second island structure;
    a first electrode, connected between the first type doped semiconductor layer of the first island structure and the second type doped semiconductor layer of the second island structure; and
    a second electrode, connected between the second type doped semiconductor layer of the first island structure and the first type doped semiconductor layer of the second island structure, wherein a LED is formed by the first electrode, the second electrode and the first island structure, and a shunt diode is formed by the first electrode, the second electrode and the second island structure, wherein the shunt diode is connected in parallel to the LED with an inverse bias compared to the LED.

2. The LED of claim 1, wherein the substrate comprises aluminum oxide, silicon carbide (SiC), zinc oxide (ZnO), silicon (Si), gallium phosphide (GaP), or gallium arsenide (GaAs) substrate.

3. The LED of claim 1, wherein the first type doped semiconductor layer comprising:
    a nucleation layer, disposed over the substrate;
    a buffer layer, disposed over the nucleation layer; and
    a first confinement layer, disposed over a portion of the buffer layer.

4. The LED of claim 3, wherein a material of the nucleation layer comprises $Al_e In_f Ga_{1-e-f} N$, $e, f \geq 0$; $0 \leq e+f \leq 1$.

5. The LED of claim 4, wherein the nucleation layer is doped with an N-type dopant or a P-type dopant.

6. The LED of claim 3, wherein a material of the buffer layer comprises $Al_c In_d Ga_{1-c-d} N$, $c, d \geq 0$; $0 \leq c+d < 1$.

7. The LED of claim 6, wherein the buffer layer is doped with an N-type dopant.

8. The LED of claim 3, wherein a material of the first confinement layer comprises N-type doped $Al_x In_y Ga_{1-x-y} N$, $x, y \geq 0$; $0 < x+y < 1$; $x > c$.

9. The LED of claim 1, wherein the light emitting layer comprises doped $Al_a In_b Ga_{1-a-b} N / Al_x In_y Ga_{1-x-y} N$ quantum well structure, $a, b \geq 0$; $0 \leq a+b < 1$; $x, y \geq 0$; $0 \leq x+y < 1$; $x > c > a$.

10. The LED of claim 9, wherein the light emitting layer is doped with an N-type dopant.

11. The LED of claim 9, wherein the light emitting layer is doped with a P-type dopant.

12. The LED of claim 1, wherein the light emitting layer comprises undoped $Al_a In_b Ga_{1-a-b} N / Al_x In_y Ga_{1-x-y} N$ quantum well structure, $a, b \geq 0$; $0 \leq a+b < 1$; $x, y \geq 0$; $0 \leq x+y < 1$; $x > c > a$.

13. The LED of claim 1, wherein the second type doped semiconductor layer comprises:
    a second confinement layer, disposed over the light emitting layer; and
    a contact layer, disposed over the second confinement layer.

14. The LED of claim 13, wherein the second confinement layer comprises $Al_x In_y Ga_{1-x-y} N$, $x, y \geq 0$; $0 \leq x+y < 1$; $x > c$.

15. The LED of claim 13, further comprising:
    a transparent conductive layer, disposed over the contact layer.

16. The LED of claim 13, wherein the contact layer comprises a strained layer superlattice (SLS), and the strained layer superlattice (SLS) comprises modulation doped $Al_u In_v Ga_{1-u-v} N / Al_x In_y Ga_{1-x-y} N$ quantum well structure, $u, v \geq 0$; $0 \leq u+v \leq 1$; $x, y \geq 0$; $0 < x+y < 1$; $x > u$.

17. The LED of claim 16, wherein the strained layer superlattice (SLS) is doped with an N-type dopant.

18. The LED of claim 16, wherein the strained layer superlattice (SLS) is doped with a P-type dopant.

19. The LED of claim 1, wherein the first electrode or the second electrode comprises Ti/Al, Ti/Al/Ti/Au, Ti/Al/Pt/Au, Ti/Al/Ni/Au, Ti/Al/Pd/Au, Ti/Al/Cr/Au, Ti/Al/Co/Au, Cr/Au, Cr/Pt/Au, Cr/Pd/Au, Cr/Ti/Au, Cr/TiWx/Au, Cr/Al/Cr/Au, Cr/Al/Pt/Au, Cr/Al/Pd/Au, Cr/Al/Ti/Au, Cr/Al/Co/Au, Cr/Al/Ni/Au, Pd/Al/Ti/Au, Pd/Al/Pt/Au, Pd/Al/Ni/Au, Pd/Al/Pd/Au, Pd/Al/Cr/Au, Pd/Al/Co/Au, Nd/Al/Pt/Au, Nd/Al/Ti/Au, Nd/Al/Ni/Au, Nd/Al/Cr/Au Nd/Al/Co/A, Hf/Al/Ti/Au, Hf/Al/Pt/Au, Hf/Al/Ni/Au, Hf/Al/Pd/Au, Hf/Al/Cr/Au, Hf/Al/Co/Au, Zr/Al/Ti/Au, Zr/Al/Pt/Au, Zr/Al/Ni/Au, Zr/Al/Pd/Au, Zr/Al/Cr/Au, Zr/Al/Co/Au, TiNx/Ti/Au, TiNx/Pt/Au, TiNx/Ni/Au, TiNx/Pd/Au, TiNx/Cr/Au, TiNx/Co/Au TiWN$_x$/Ti/Au, TiWN$_x$/Pt/Au, TiWN$_x$/Ni/Au, TiWN$_x$/Pd/Au, TiWN$_x$/Cr/Au, TiWN$_x$/Co/Au, NiAl/Pt/Au, NiAl/Cr/Au, NiAl/Ni/Au, NiAl/Ti/Au, Ti/NiAl/Pt/Au, Ti/NiAl/Ti/Au, Ti/NiAl/Ni/Au, or Ti/NiAl/Cr/Au.

20. The LED of claim 15, wherein the transparent conductive layer comprises Ni/Au, Ni/Pt, Ni/Pd, Ni/Co, Pd/Au, Pt/Au, Ti/Au, Cr/Au, Sn/Au, Ta/Au, TiN, TiWN$_x$ or WSi$_x$.

21. The LED of claim 15, wherein the transparent conductive layer comprises a N-type transparent conductive oxide layer or a P-type transparent conductive oxide layer.

22. The LED of claim 21, wherein the N-type transparent conductive oxide layer comprises ITO, CTO, ZnO:Al, ZnGa$_2$O$_4$, SnO$_2$:Sb, Ga$_2$O$_3$:Sn, AgInO$_2$:Sn or In$_2$O$_3$:Zn.

23. The LED of claim 21, wherein the P-type transparent conductive oxide layer comprises CuAlO$_2$, LaCuOS, NiO, CuGaO$_2$ or SrCu$_2$O$_2$.

24. The LED of claim 1, wherein the shunt diode comprises a Schottky diode.

25. The LED of claim 1, wherein the shunt diode comprises a Zener diode.

26. The LED of claim 1, wherein the shunt diode comprises a heterojunction diode.

* * * * *